(12) United States Patent
Choi et al.

(10) Patent No.: US 7,432,634 B2
(45) Date of Patent: *Oct. 7, 2008

(54) REMOTE CENTER COMPLIANT FLEXURE DEVICE

(75) Inventors: Byung-Jin Choi, Austin, TX (US); Sidlgata V. Sreenivasan, Austin, TX (US); Stephen C. Johnson, Austin, TX (US)

(73) Assignee: Board of Regents, University of Texas System, Austin, TX (US)

( * ) Notice: Subject to any disclaimer, the term of this patent is extended or adjusted under 35 U.S.C. 154(b) by 575 days.

This patent is subject to a terminal disclaimer.

(21) Appl. No.: 11/068,526

(22) Filed: Feb. 28, 2005

(65) Prior Publication Data

US 2005/0260295 A1 Nov. 24, 2005

Related U.S. Application Data

(62) Division of application No. 09/698,317, filed on Oct. 27, 2000, now Pat. No. 6,873,087, and a division of application No. 10/616,799, filed on Jul. 10, 2003, now abandoned, and a division of application No. 10/617,321, filed on Jul. 10, 2003, now Pat. No. 6,870,301, and a division of application No. 10/775,707, filed on Feb. 10, 2004, now Pat. No. 6,922,906, and a division of application No. 10/785,248, filed on Feb. 24, 2004, now Pat. No. 6,955,868, and a division of application No. 10/788,685, filed on Feb. 27, 2004, now Pat. No. 7,060,402, and a division of application No. 10/806,956, filed on Mar. 23, 2004, now Pat. No. 7,098,572.

(51) Int. Cl.
*H02N 2/00* (2006.01)

(52) U.S. Cl. .................................. 310/323.17; 310/328

(58) Field of Classification Search ............ 310/323.17, 310/328; 216/44, 52, 53; 438/691, 700, 438/735

See application file for complete search history.

(56) References Cited

U.S. PATENT DOCUMENTS 3,527,062 A 9/1970 Bilinski et al.

(Continued)

FOREIGN PATENT DOCUMENTS

JP 55-88332 7/1980

(Continued)

OTHER PUBLICATIONS

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

(Continued)

*Primary Examiner*—Thomas M Dougherty
(74) *Attorney, Agent, or Firm*—Fish & Richardson P.C.

(57) ABSTRACT

An apparatus to control displacement of a body spaced-apart from a surface includes a flexure system having a first flexure member defining a first axis of rotation and a second flexure member defining a second axis of rotation. A body is coupled to the flexure system to move about a plurality of axes. An actuation system is coupled to the flexure system to selectively constrain movement of the body along a subset of the plurality of axes.

17 Claims, 14 Drawing Sheets

U.S. PATENT DOCUMENTS

| | | | |
|---|---|---|---|
| 4,098,001 A | 7/1978 | Watson | |
| 4,155,169 A | 5/1979 | Drake et al. | |
| 4,202,107 A | 5/1980 | Watson | |
| 4,355,469 A | 10/1982 | Nevins et al. | |
| 4,512,848 A | 4/1985 | Deckman et al. | |
| 4,731,155 A | 3/1988 | Napoli et al. | |
| 4,848,179 A | 7/1989 | Ubhayakar | |
| 4,959,252 A | 9/1990 | Bonnebat et al. | |
| 5,028,366 A | 7/1991 | Harakal et al. | |
| 5,063,321 A | 11/1991 | Carter | |
| 5,094,533 A | 3/1992 | Sawada et al. | |
| 5,110,514 A | 5/1992 | Soane | |
| 5,179,863 A | 1/1993 | Uchida et al. | |
| 5,240,550 A | 8/1993 | Boehnke et al. | |
| 5,259,926 A | 11/1993 | Kuwabara et al. | |
| 5,270,984 A | 12/1993 | Mine | |
| 5,355,219 A | 10/1994 | Araki et al. | |
| 5,392,123 A | 2/1995 | Marcus et al. | |
| 5,425,848 A | 6/1995 | Haisma et al. | |
| 5,480,047 A | 1/1996 | Tanigawa et al. | |
| 5,512,131 A | 4/1996 | Kumar et al. | |
| 5,545,367 A | 8/1996 | Bae et al. | |
| 5,601,641 A | 2/1997 | Stephens | |
| 5,669,303 A | 9/1997 | Maracas et al. | |
| 5,772,905 A | 6/1998 | Chou | |
| 5,776,748 A | 7/1998 | Singhvi et al. | |
| 5,820,769 A | 10/1998 | Chou | |
| 5,849,209 A | 12/1998 | Kindt-Larsen et al. | |
| 5,849,222 A | 12/1998 | Jen et al. | |
| 5,888,650 A | 3/1999 | Calhoun et al. | |
| 5,948,470 A | 9/1999 | Harrison et al. | |
| 5,956,216 A | 9/1999 | Chou | |
| 5,963,315 A | 10/1999 | Hiatt et al. | |
| 6,046,056 A | 4/2000 | Parce et al. | |
| 6,074,827 A | 6/2000 | Nelson et al. | |
| 6,188,150 B1 | 2/2001 | Spence | |
| 6,218,316 B1 | 4/2001 | Marsh | |
| 6,274,294 B1 | 8/2001 | Hines | |
| 6,309,580 B1 | 10/2001 | Chou | |
| 6,326,627 B1 | 12/2001 | Putvinski et al. | |
| 6,334,960 B1 | 1/2002 | Willson et al. | |
| 6,348,999 B1 | 2/2002 | Summersgill et al. | |
| 6,355,198 B1 | 3/2002 | Kim et al. | |
| 6,391,217 B2 | 5/2002 | Schaffer et al. | |
| 6,411,010 B1 | 6/2002 | Suzuki et al. | |
| 6,449,035 B1 | 9/2002 | Batchelder | |
| 6,467,761 B1 | 10/2002 | Amatucci et al. | |
| 6,482,742 B1 | 11/2002 | Chou | |
| 6,517,977 B2 | 2/2003 | Resnick et al. | |
| 6,517,995 B1 | 2/2003 | Jacobson et al. | |
| 6,518,189 B1 | 2/2003 | Chou | |
| 6,580,172 B2 | 6/2003 | Mancini et al. | |
| 6,646,662 B1 | 11/2003 | Nebashi et al. | |
| 6,696,220 B2 | 2/2004 | Bailey et al. | |
| 6,713,238 B1 | 3/2004 | Chou et al. | |
| 6,776,094 B1 | 8/2004 | Whitesides et al. | |
| 6,791,669 B2 | 9/2004 | Poon | |
| 6,809,356 B2 | 10/2004 | Chou | |
| 6,825,437 B2 | 11/2004 | Nakano et al. | |
| 6,828,244 B2 | 12/2004 | Chou | |
| 6,841,048 B2 | 1/2005 | Matt | |
| 6,849,558 B2 | 2/2005 | Schaper | |
| 6,870,301 B2 | 3/2005 | Choi et al. | |
| 6,873,087 B1 * | 3/2005 | Choi et al. | 310/323.17 |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,921,615 B2 | 7/2005 | Sreenivasan et al. | |
| 6,922,906 B2 | 8/2005 | Choi et al. | |
| 6,932,934 B2 * | 8/2005 | Choi et al. | 264/496 |
| 6,946,360 B2 | 9/2005 | Chou | |
| 6,955,868 B2 | 10/2005 | Choi et al. | |
| 6,995,499 B2 * | 2/2006 | Hwang | 310/328 |
| 7,024,925 B2 * | 4/2006 | Gweon et al. | 73/105 |
| 7,060,402 B2 | 6/2006 | Choi et al. | |
| 7,077,992 B2 | 7/2006 | Sreenivasan et al. | |
| 7,098,572 B2 | 8/2006 | Choi et al. | |
| 7,218,032 B2 * | 5/2007 | Kim | 310/323.17 |
| 7,218,035 B2 * | 5/2007 | Khajepour et al. | 310/328 |
| 2002/0042027 A1 | 4/2002 | Chou et al. | |
| 2002/0132482 A1 | 9/2002 | Chou | |
| 2002/0167117 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2004/0036201 A1 | 2/2004 | Chou et al. | |
| 2004/0046288 A1 | 3/2004 | Chou | |
| 2004/0110856 A1 | 6/2004 | Young et al. | |
| 2004/0118809 A1 | 6/2004 | Chou et al. | |
| 2004/0131718 A1 | 7/2004 | Chou et al. | |
| 2004/0137734 A1 | 7/2004 | Chou et al. | |
| 2004/0149687 A1 | 8/2004 | Choi et al. | |
| 2004/0156108 A1 | 8/2004 | Chou et al. | |
| 2004/0192041 A1 | 9/2004 | Jeong et al. | |
| 2004/0197843 A1 | 10/2004 | Chou et al. | |
| 2004/0250945 A1 | 12/2004 | Zheng et al. | |
| 2005/037143 A1 | 2/2005 | Chou et al. | |
| 2005/0264132 A1 | 12/2005 | Choi et al. | |
| 2005/0275311 A1 * | 12/2005 | Choi et al. | 310/323.05 |
| 2006/0062867 A1 | 3/2006 | Choi et al. | |
| 2006/0076717 A1 | 4/2006 | Sreenivasan et al. | |
| 2006/0077374 A1 * | 4/2006 | Sreenivasan et al. | 355/72 |
| 2006/0203234 A1 | 9/2006 | Gilton | |
| 2006/0266734 A1 * | 11/2006 | Fujii et al. | 216/44 |

FOREIGN PATENT DOCUMENTS

| | | |
|---|---|---|
| JP | 57-7931 | 1/1982 |
| JP | 63-138730 | 6/1988 |
| JP | 63-194956 | 8/1988 |
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 57-7931, Apr. 14, 2004.
Abstract of Japanese Patent 63-138730, Apr. 14, 2004.
Abstract of Japanese Patent 55-88332, Apr. 14, 2004.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Hiroshima et al., Step-and-Repeat Photo-Nanoimprint System Using Active Orientation Head, Japanese Journal of Applied Physics, vol. 43, No. 6B, pp. 4012-4016 Jun. 29, 2004.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/694,017, naming Inventors Jones et al., entitled Residual Layer Thickness Measurement and Correction, filed Mar. 30, 2007.

U.S. Appl. No. 11/737,301, naming Inventors Schumaker, entitled Method for Detecting a Particle in a Nanoimprint Lithography System, filed Apr. 19, 2007.

Shao et al., Near-Field Enhanced, Mold-Assisted, Parallel Direct Nanostructuring of a Gold Thin Film on Glass, Applied Physics Letters, vol. 85(22), pp. 5346-5349 Nov. 29, 2004.

Li et al., Nanopatterning of a Silicon Surface by Near-Field Enhanced Laser Irradiation, Nanotechnology, vol. 14(5), pp. 505-508 Jan. 1, 2003.

Liu et al., Focusing Surface Plasmons with a Plasmonic Lens, Nano Lett, 5(9), pp. 1726-1729 Jul. 29, 2005.

Nozoe et al., Recent Technology for Particle Detection on Patterned Wafers, Proceedings of 1995 IEEE International Reliability Physics Symposium Apr. 6, 1995.

Kuwabara et al., Detection of Particles on Quarter mu m Thick or Thinner SOI Wafers, Jpn. J. Appl. Phys. 1, Regul. Pap. Short Notes Rev. Pap. Apr. 1, 1999.

Hattori, Measurements of Particles on Wafer Surfaces, Ultraclean Surface Processing of Silicon Wafers Secrets of VLSI manufacturing Jan. 1, 1998.

Nozoe et al., Advanced Surface Inspection Techniques for SOI Wafers, Proc. SPIE—Int. Soc. Opt. Eng. Jan. 1, 1998.

Hattori et al., Challenges of Finer Particle Detection on Bulk-Silicon and SOI Wafers, Diffus. Defect Data B, Solid State Phenom. Jan. 1, 2005.

Abstract of Japanese patent 02-192045, Jul. 27, 1990.

Williams et al., Six Degree of Freedom Mag-Lev Stage Development, SPIE vol. 3051, 856-867 Jan. 1, 1997.

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Lee et al., Ultra Precision Positioning System for Servo Motor-piezo Actuator Using the Dual Servo Loop and Digital Filter Implementation, American Society for Precision Engineering, pp. 287-290 Jan. 1, 1998.

Chou, Nanoimprint Lithography and Lithographically Induced Self-Assembly, MRS Bulletin, pp. 512-517 Jul. 1, 2001.

Tajbakhsh et al., Three-Degree-of-Freedom Optic Mount for Extreme Ultraviolet Lithography, American Society for Precision Engineering, pp. 359-362 Jan. 1, 1998.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Koseki, Design and Accuracy Evaluation of High-Speed and High Precision Parallel Mechanism, Proc. Of IEEE, Intl Conf. on Robotics & Automation, pp. 1340-1345 Jan. 1, 1998.

Mittal, Precision Motion Control of a Magnetic Suspension Actuator Using a Robust Nonlinear Compensation Scheme, IEE/ASME Transactions of Mechatronics. vol. 2. No. 4, pp. 268-280 Dec. 1, 1997.

Rong et al., Dynamics of Parallel Mechanism with Direct Compliance Control, IEEE, pp. 1753-1758 Jan. 1, 1997.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Stewart, A Platform With Six Degrees of Freedom, Proc Instn Mech Engrs, vol. 180 Pt 1 No. 15, pp. 371-378 May 28, 1965.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Raibert et al., Hybrid Position/Force Control of Manipulators, Journal of Dynamic Systems, Measurement, and Control, vol. 102, pp. 126-133 Jun. 1, 1981.

* cited by examiner

REMOTE CENTER COMPLIANT FLEXURE DEVICE

CROSS-REFERENCE TO RELATED APPLICATIONS

This application is a divisional patent application of U.S. patent application Ser. No. 09/698,317, filed Oct. 27, 2000 and entitled "High-Precision Orientation Alignment and Gap Control Stage for Imprint Lithography Processes"; U.S. patent application Ser. No. 10/616,799, filed Jul. 10, 2003, entitled "Method of Manufacturing a Vacuum Chuck Used in Imprint Lithography"; U.S. patent application Ser. No. 10/617,321, filed Jul. 10, 2003 and entitled "Method of Separating a Template from a Substrate During Imprint Lithography"; U.S. patent application Ser. No. 10/775,707, filed Feb. 10, 2004, entitled "Apparatus to Orientate a Body with Respect to a Surface"; U.S. patent application Ser. No. 10/785,248, filed Feb. 24, 2004, entitled "Method to Control the Relative Position Between a Body and a Substrate"; U.S. patent application Ser. No. 10/788,685, filed Feb. 27, 2004, entitled "Method of Orientating a Template with Respect to a Substrate in Response to a Force Exerted on the Template"; U.S. patent application Ser. No. 10/806,956, filed Mar. 23, 2004, entitled "Apparatus to Control Displacement of a Body Spaced-Apart from a Surface," all having Byung J. Choi, Sidlgata V. Sreenivasan, and Steven C. Johnson listed as inventors, and all of the aforementioned patent applications being incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N66001-98-1-8914 awarded by the Defense Advanced Research Projects Agency (DARPA). provided for by the terms of N66001-98-1-8914 awarded by the Defense Advanced Research Projects Agency (DARPA).

TECHNICAL FIELD

The invention relates in general to techniques for small device manufacturing and specifically to a system, processes and related devices for high precision imprint lithography enabling the manufacture of extremely small features on a substrate, such as a semiconductor wafer. More specifically, the invention relates to methods and components for the orientation and the alignment of a template about a substrate, as well as their separation without destruction of imprinted features.

BACKGROUND OF THE INVENTION

Without limiting the invention, its background is described in connection with a process for the manufacture of sub-100 nm devices using imprint lithography.

In manufacturing, lithography techniques that are used for large-scale production include photolithography and other application oriented lithography techniques, such as electron beam lithography, ion-beam and x-ray lithography, as examples. Imprint lithography is a type of lithography that differs from these techniques. Recent research has shown that imprint lithography techniques can print features that are smaller than 50 nm. As such, imprint lithography has the potential to replace photolithography as the choice for semiconductor manufacturing in the sub-100 nm regime. It can also enable cost effective manufacturing of various kinds of devices, including patterned magnetic media for data storage, micro optical devices, MEMS, biological and chemical devices, X-ray optical devices, etc. Current research in the area of imprint lithography has revealed a need for devices that can perform orientation alignment motions between a template, which contains the imprint image, and a substrate, which receives the image. Of critical importance is the careful and precise control of the gap between the template and the substrate. To be successful, the gap may need to be controlled within a few nanometers across the imprinting area, while, at the same time, relative lateral motions between the template and the substrate must be eliminated. This absence of relative motion leads is also preferred since it allows for a complete separation of the gap control problem from the overlay alignment problem.

For the specific purpose of imprinting, it is necessary to maintain two flat surfaces as close to each other as possible and nearly parallel. This requirement is very stringent as compared to other proximity lithography techniques. Specifically, an average gap of about 100 nm with a variation of less than 50 nm across the imprinted area is required for the imprint process to be successful at sub-100 nm scales. For features that are larger, such as, for example, MEMS or micro optical devices, the requirement is less stringent. Since imprint processes inevitably involve forces between the template and the wafer, it is also desirable to maintain the wafer surface as stationary as possible during imprinting and separation processes. Overlay alignment is required to accurately align two adjacent layers of a device that includes multiple lithographically fabricated layers. Wafer motion in the x-y plane can cause loss of registration for overlay alignment. Prior art references related to orientation and motion control include U.S. Pat. No. 4,098,001, entitled "Remote Center Compliance System;" U.S. Pat. No. 4,202,107, entitled "Remote Axis Admittance System," both by Paul C. Watson; and U.S. Pat. No. 4,355,469 entitled "Folded Remote Center Compliant Device" by James L. Nevins and Joseph Padavano. These patents relate to fine decoupled orientation stages suitable for aiding insertion and mating maneuvers in robotic machines and docking and assembly equipment. The similarity between these prior art patents and the present invention is in the provision for deformable components that generate rotational motion about a remote center. Such rotational motion is generated, for example, via deformations of three cylindrical components that connect an operator and a subject in parallel.

The prior art patents do not, however, disclose designs with the necessary high stiffness to avoid lateral and twisting motions. In fact, such lateral motion is desirable in automated assembly to overcome mis-alignments during the assembly process. Such motion is highly undesirable in imprint lithography since it leads to unwanted overlay errors and could lead to shearing of fabricated structures. Therefore, the kinematic requirements of automated assembly are distinct from the requirements of high precision imprint lithography. The design shown in U.S. Pat. No. 4,355,469 is intended to accommodate larger lateral and rotational error than the designs shown in the first two patents, but this design does not have the capability to constrain undesirable lateral and twisting motions for imprint lithography.

Another prior art method is disclosed in U.S. Pat. No. 5,772,905 (the '905 patent) by Stephen Y. Chou, which describes a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. First, the mold is removed from the film. The thin film is then processed such that the thin film in the recess is removed exposing the underlying substrate. Thus, the patterns in the mold are replaced in the thin film, completing the lithography. The patterns in the thin film will be, in subsequent processes, reproduced in the substrate or in another material which is added onto the substrate.

The process of the '905 patent involves the use of high pressures and high temperatures to emboss features on a material using micro molding. The use of high temperatures and pressures, however, is undesirable in imprint lithography since they result in unwanted stresses being placed on the device. For example, high temperatures cause variations in the expansion of the template and the substrate. Since the template and the substrate are often made of different materials, expansion creates serious layer-to-layer alignment problems. To avoid differences in expansion, the same material can be used but this limits material choices and increases overall costs of fabrication. Ideally, imprint lithography could be carried out at room temperatures and low pressures.

Moreover, the '905 patent provides no details relative to the actual apparatus or equipment that would be used to achieve the process. In order to implement any imprint lithography process in a production setting, a carefully designed system must be utilized. Thus, a machine that can provide robust operation in a production setting is required. The '905 patent does not teach, suggest or disclose such a system or a machine.

Another issue relates to separation of the template from the substrate following imprinting. Typically, due to the nearly uniform contact area at the template-to-substrate interface, a large separation force is needed to pull the layers apart. Such force, however, could lead to shearing and/or destruction of the features imprinted on the substrate, resulting in decreased yields.

In short, currently available orientation and overlay alignment methods are unsuitable for use with imprint lithography. A coupling between desirable orientation alignment and undesirable lateral motions can lead to repeated costly overlay alignment errors whenever orientation adjustments are required prior to printing of a field (a field could be for example a 1" by 1" region of an 8" wafer).

Further development of precise stages for robust implementation of imprint lithography is required for large-scale imprint lithography manufacturing. As such, a need exists for an improved imprint lithography process. A way of using imprint lithography as a fabrication technique without high pressures and high temperatures would provide numerous advantages.

SUMMARY OF THE INVENTION

An apparatus to control displacement of a body spaced-apart from a surface features an actuation system coupled to a flexure system to selectively constrain movement of a body coupled to the flexure system along a subset of the plurality of axes. In this manner, unwanted movement of the body may be constrained to facilitate improved imprinting techniques. To that end, the apparatus includes a first flexure member defining a first axis of rotation and a second flexure member defining a second axis of rotation. The first and the second flexure members are included in the flexure system. The body is coupled to the flexure system to move about a plurality of axes. The actuation system is coupled to the flexure system. In one embodiment, the actuation system provides resistance to translational displacement of said body with respect to a said subset of axes, while allowing free translation displacement with respect to axes outside of said subset, and resistance to rotational displacement of said body with respect to a subgroup of the plurality of axes, while allowing free rotational displacement of said body with respect to axes outside of said subgroup. To that end, the actuation system may include one or more piezo actuators. These and other embodiments are discussed more fully below.

BRIEF DESCRIPTION OF THE DRAWINGS

The above objects and advantages, as well as specific embodiments, are better understood by reference to the following detailed description taken in conjunction with the appended drawings in which.

References in the figures correspond to those in the detailed description unless otherwise indicated.

DETAILED DESCRIPTION OF THE EMBODIMENTS

Without limiting the invention, it is herein described in connection with a system, devices, and related processes for imprinting very small features (sub-100 nanometer (nm) range) on a substrate, such as a semiconductor wafer, using methods of imprint lithography. It should be understood that the present invention can have application to other tasks, such as, for example, the manufacture of cost-effective Micro-Electro-Mechanical Systems (or MEMS), as well as various kinds of devices, including patterned magnetic media for data storage, micro optical devices, biological and chemical devices, X-ray optical devices, etc.

Figure 1A:
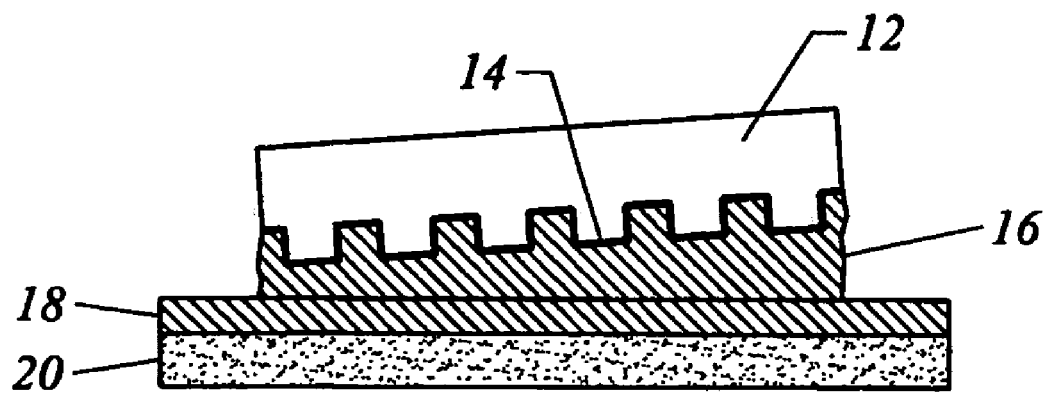
FIGS. 1A and 1B show undesirable gap between a template and a substrate.
Figure 1B:
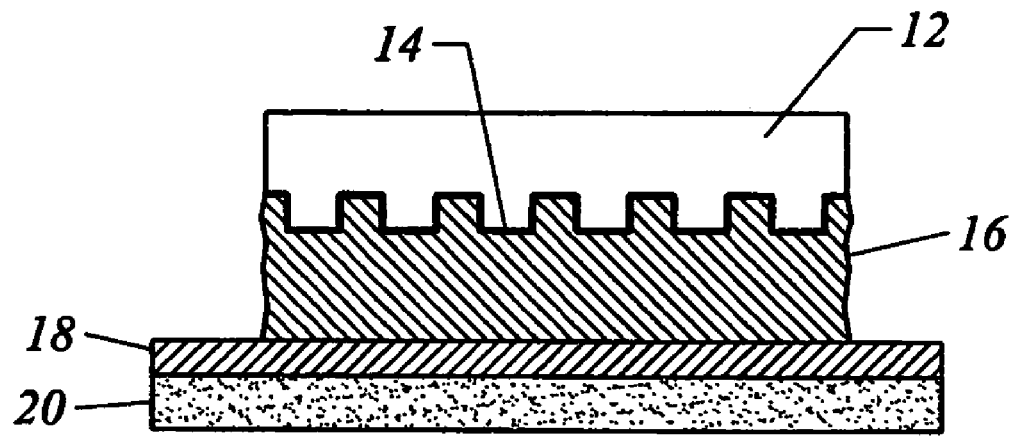

With reference now to the figures and specifically to FIGS. 1A and 1B, therein are shown arrangements of a template 12 predisposed with respect to a substrate 20 upon which desired features are to be imprinted using imprint lithography. Specifically, template 12 includes a surface 14 that has been fabricated to take on the shape of desired features which, in turn, are transferred to substrate 20. Between substrate 20 and template 12 lies a transfer layer 18, which receives the desired features from template 12 via an imprinted layer 16. As is well known in the art, transfer layer 18 allows one to obtain high aspect ratio structures (or features) from low aspect ratio imprinted features.

In FIG. 1A, a wedge-shaped imprinted layer 16 results so that template 12 is closer to substrate 20 at one end of imprinted layer 16. FIG. 1B shows imprinted layer 16 being too thick. Both of these conditions are highly undesirable. The present invention provides a system, processes and related devices for eliminating the conditions illustrated in FIGS. 1A and 1B, as well as other orientation problems associated with prior art lithography techniques.

Specifically, for the purpose of imprint lithography, it is necessary to maintain template 12 and substrate 20 as close to each other as possible and nearly parallel. This requirement is very stringent as compared to other proximity lithography techniques, such as proximity printing, contact printing, and X-ray lithography, as examples. Thus, for example, for features that are 100 nm wide and 100 nm deep, an average gap of about 200 nm or less with a variation of less than 50 nm across the imprinting area of substrate 20 is required for the imprint lithography process to be successful. The present invention provides a way of controlling the spacing between template 12 and substrate 20 for successful imprint lithography given such tight and precise gap requirements.

Figure 2A:
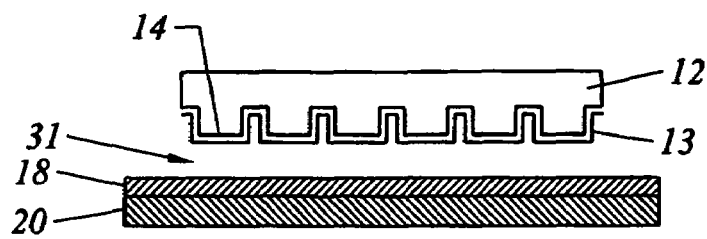
FIGS. 2A through 2E illustrate a version of the imprint lithography process according to the invention.
Figure 2B:
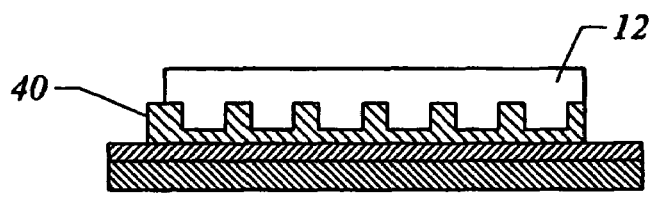

FIGS. 2A through 2E illustrate the process, denoted generally as 30, of imprint lithography according to the invention. In FIG. 2A, template 12 is orientated in spaced relation to substrate 20 so that a gap 31 is formed in the space separating template 12 and substrate 20. Surface 14 of template 12 is treated with a thin layer 13 to lower the template surface energy and to assist in separation of template 12 from substrate 20. The manner of orientation including devices for controlling gap 31 between template 12 and substrate 20 is discussed below. Next, in FIG. 2B, gap 31 is filled with a substance 40 that conforms to the shape of the treated surface 14. Essentially, substance 40 forms imprinted layer 16 shown in FIGS. 1A and 1B. Preferably, substance 40 is a liquid so that it fills the space of gap 31 rather easily without the use of high temperatures and gap 31 can be closed without requiring high pressures.

Figure 2C:
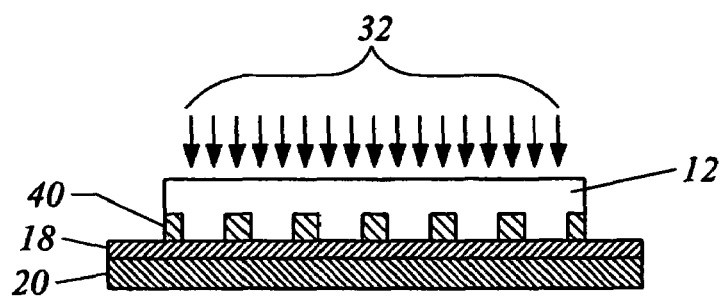

A curing agent 32, shown in FIG. 2C, is applied to template 12 causing substance 40 to harden and to assume the shape of the space defined by gap 31 between template 12 and substrate 20. In this way, desired features 44, shown in FIG. 2D, from template 12 are transferred to the upper surface of substrate 20. Transfer layer 18 is provided directly on the upper surface of substrate 20 which facilitates the amplification of features transferred from template 12 onto substrate 20 to generate high aspect ratio features.

Figure 2D:
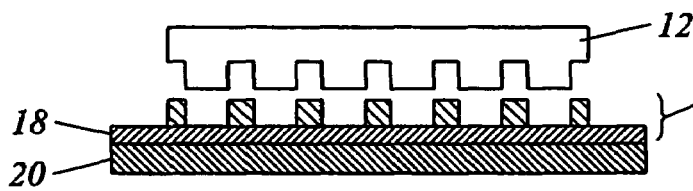

In FIG. 2D, template 12 is removed from substrate 20, leaving the desired features 44 thereon. The separation of template 12 from substrate 20 must be done so that desired features 44 remain intact without shearing or tearing from the surface of substrate 20. The present invention provides a method and an associated system for peeling and pulling (referred to herein as the "peel-and-pull" method) template 12 from substrate 20 following imprinting so the desired features 44 remain intact.

Figure 2E:
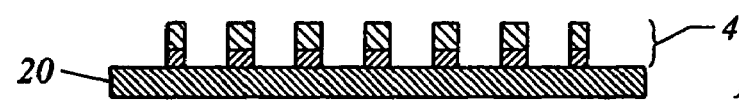
Figure 3:
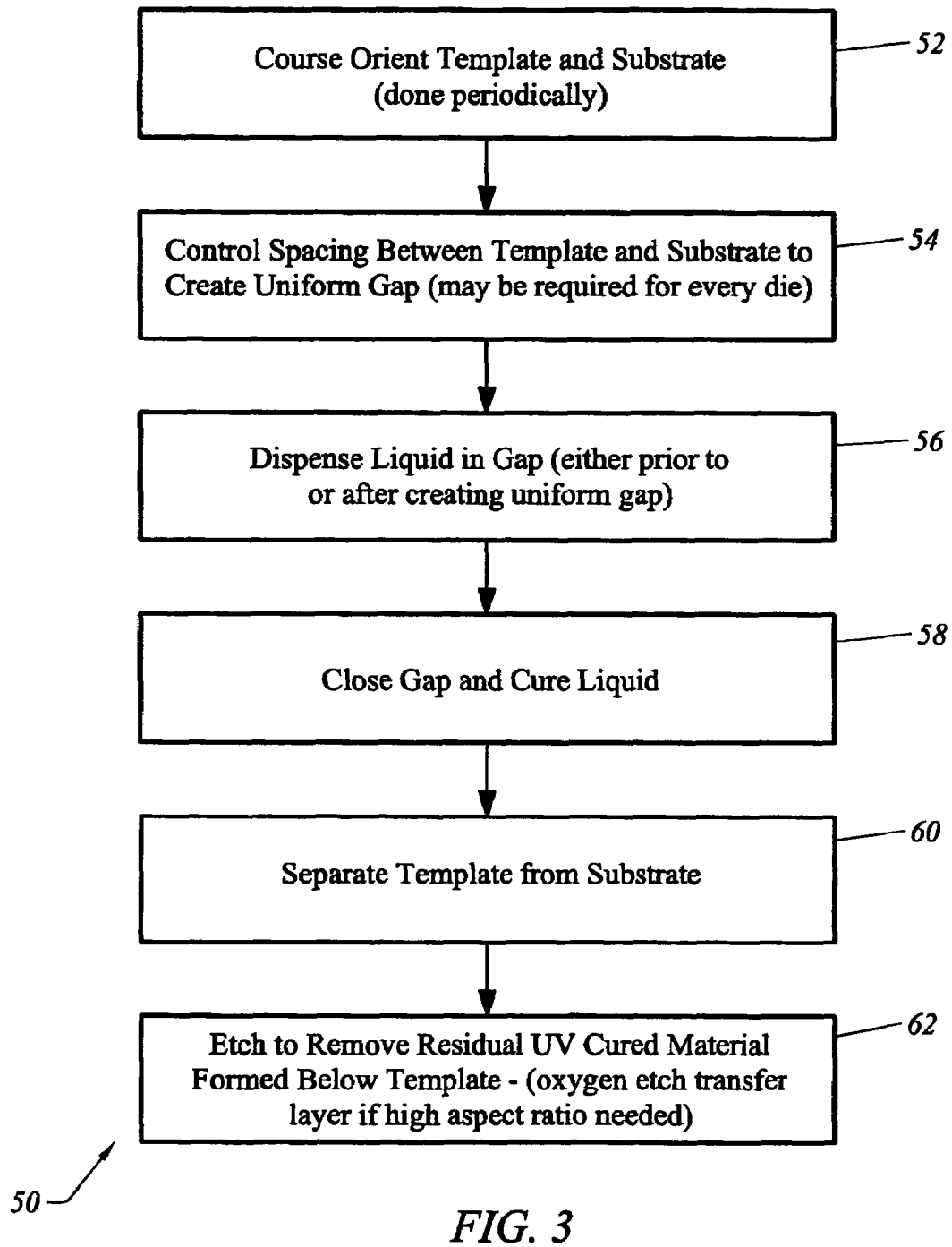
FIG. 3 is a process flow diagram showing the sequence of steps of the imprint lithography process of FIGS. 2A through 2E.

Finally, in FIG. 2E, features 44 transferred from template 12, shown in FIG. 2D, to substrate 20 are amplified in vertical size by the action of transfer layer 18, as is known in the use of bi-layer resist processes. The resulting structure can be further processed to complete the manufacturing process using well-known techniques. FIG. 3 summarizes the imprint lithography process, denoted generally as 50, of the present invention in flow chart form. Initially, at step 52, course orientation of a template and a substrate is performed so that a rough alignment of the template and the substrate is achieved. The advantage of course orientation at step 52 is that it allows pre-calibration in a manufacturing environment where numerous devices are to be manufactured with efficiency and with high production yields. For example, where the substrate comprises one of many die on a semiconductor wafer, course alignment (step 52) can be performed once on the first die and applied to all other dies during a single production run. In this way, production cycle times are reduced and yields are increased.

Next, at step 54, the spacing between the template and the substrate is controlled so that a relatively uniform gap is created between the two layers permitting the type of precise orientation required for successful imprinting. The present invention provides a device and a system for achieving the type of orientation (both course and fine) required at step 54. At step 56, a liquid is dispensed into the gap between the template and the substrate. Preferably, the liquid is a UV curable organosilicon solution or other organic liquids that become a solid when exposed to UV light. The fact that a liquid is used eliminates the need for high temperatures and high pressures associated with prior art lithography techniques.

At step 58, the gap is closed with fine orientation of the template about the substrate and the liquid is cured resulting in a hardening of the liquid into a form having the features of the template. Next, the template is separated from the substrate, step 60, resulting in features from the template being imprinted or transferred onto the substrate. Finally, the structure is etched, step 62, using a preliminary etch to remove residual material and a well-known oxygen etching technique is used to etch the transfer layer.

As discussed above, requirements for successful imprint lithography include precise alignment and orientation of the template with respect to the substrate to control the gap in between the template and the substrate. The present invention provides a system capable of achieving precise alignment and gap control in a production style fabrication process. Essentially, the system of the present invention provides a pre-calibration stage for performing a preliminary and a course alignment operation between the template and the substrate surface to bring the relative alignment to within the motion range of a fine movement orientation stage. This pre-calibration stage is required only when a new template is installed into the machine (also sometimes known as a stepper) and consists of a base plate, a flexure component, and three micrometers or higher resolution actuators that interconnect the base plate and the flexure component.

Figure 4:
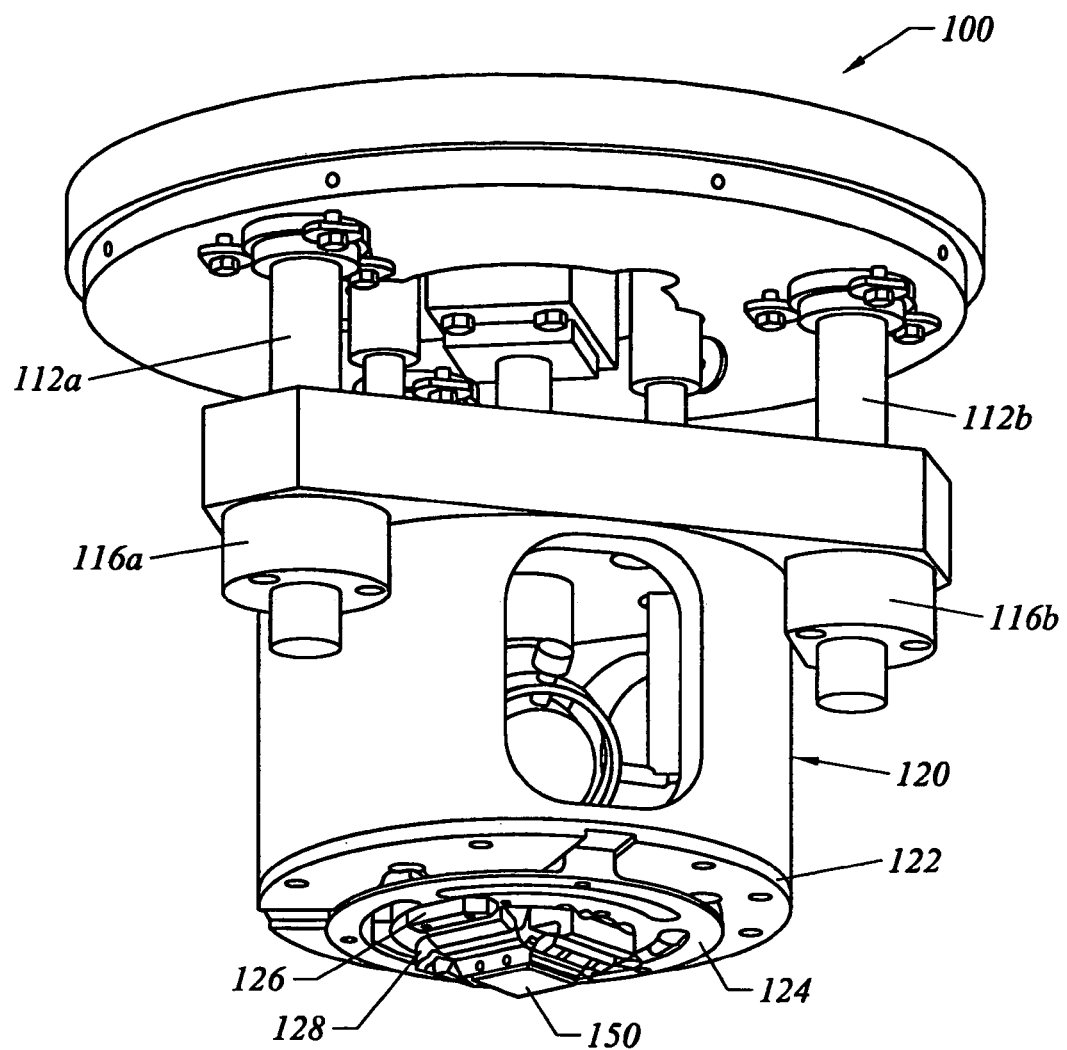
FIG. 4 shows an assembly of an orientation alignment and a gap control system, including both a course calibration stage and a fine orientation alignment and a gap control stage according to one embodiment of the invention.

With reference to FIG. 4, therein is shown an assembly of the system, denoted generally as 100, for calibrating and orienting a template, such as template 12, shown in FIG. 1A, about a substrate to be imprinted, such as substrate 20. System 100 can be utilized in a machine, such as a stepper, for mass fabrication of devices in a production type environment using the imprint lithography processes of the present invention. As shown, system 100 is mounted to a top frame 110 which provides support for a housing 120 which contains the pre-calibration stage for course alignment of a template 150 about a substrate (not shown in FIG. 4).

Housing 120 is seen coupled to a middle frame 114 with guide shafts 112a and 112b attached to middle frame 114 opposite housing 120. In one embodiment, three (3) guide shafts are used (the back guide shaft is not visible in FIG. 4) to provide a support for housing 120 as it slides up and down during vertical translation of template 150. This up-and-down motion of housing 120 is facilitated by sliders 116a and 116b which attach to corresponding guide shafts 112a and 112b about middle frame 114.

Figure 5:
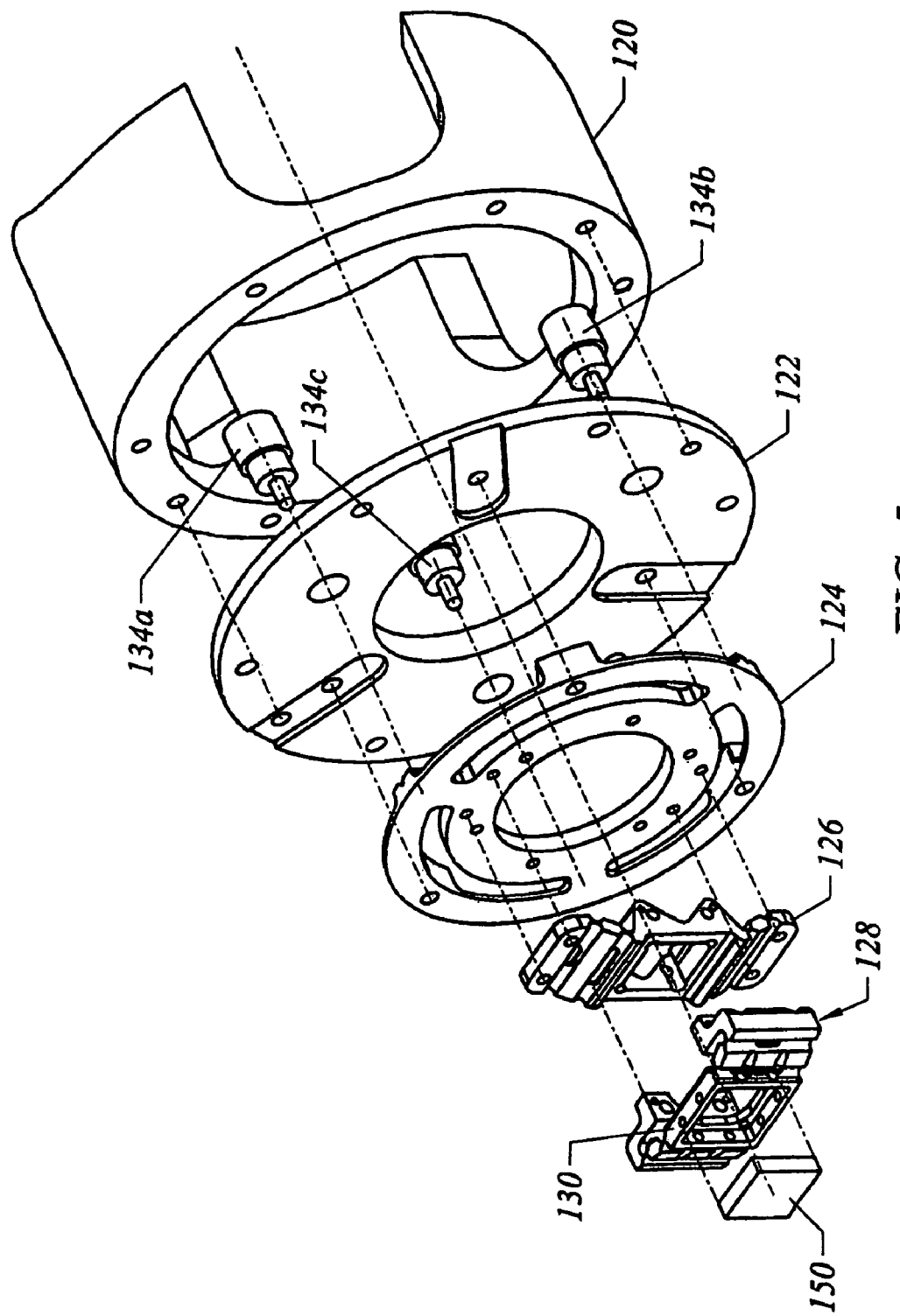
FIG. 5 is an exploded view of the system of FIG. 4.

System 100 includes a disk-shaped base plate 122 attached to the bottom portion of housing 120 which, in turn, is coupled to a disk-shaped flexure ring 124 for supporting the lower placed orientation stage comprised of first flexure member 126 and second flexure member 128. The operation and the configuration of flexure members 126 and 128 are discussed in detail below. In FIG. 5, second flexure member 128 is seen to include a template support 130, which holds template 150 in place during the imprinting process. Typically, template 150 comprises a piece of quartz with desired features imprinted on it, although other template substances may be used according to well-known methods.

As shown in FIG. 5, three (3) actuators 134a, 134b and 134c are fixed within housing 120 and are operably coupled to base plate 122 and flexure ring 124. In operation, actuators 134a, 134b and 134c would be controlled such that motion of flexure ring 124 is achieved. This allows for coarse pre-calibration. Actuators 134a, 134b and 134c can also be high resolution actuators which are equally spaced-apart about housing 120 permitting the additional functionality of very precise translation of flexure ring 124 in the vertical direction to control the gap accurately. In this way, system 100, shown in FIG. 4, is capable of achieving coarse orientation alignment and precise gap control of template 150 with respect to a substrate to be imprinted.

System 100 of the present invention provides a mechanism that enables precise control of template 150 so that precise orientation alignment is achieved and a uniform gap is maintained by the template with respect to a substrate surface. Additionally, system 100 provides a way of separating template 150 from the surface of the substrate following imprinting without shearing of features from the substrate surface. The precise alignment, the gap control and the separation features of the present invention are facilitated mainly by the configuration of first and second flexure members 126 and 128, respectively.

Figure 6A:
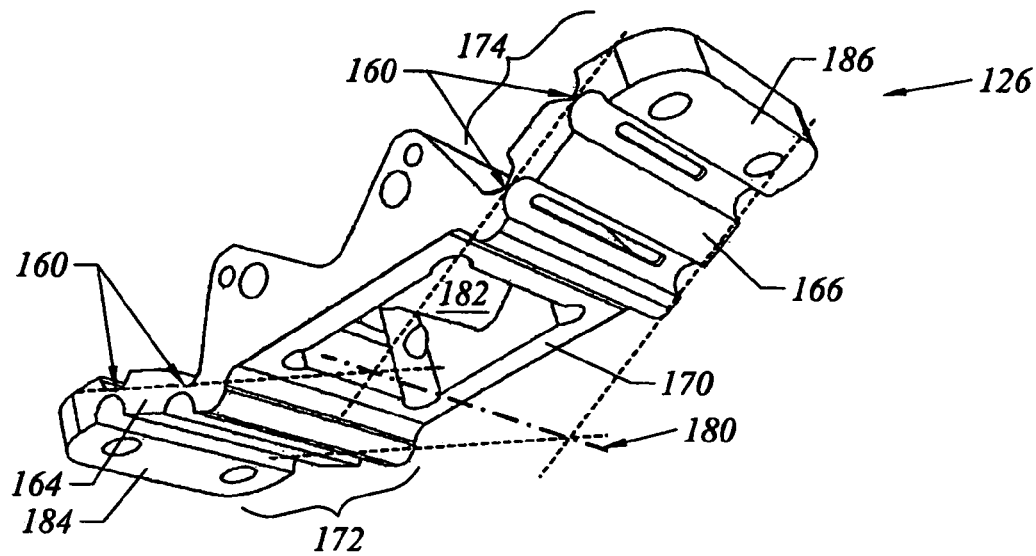
FIGS. 6A and 6B show first and second orientation substages, respectively, in the form of first and second flexure members with flexure joints according to one embodiment of the invention.
Figure 6B:
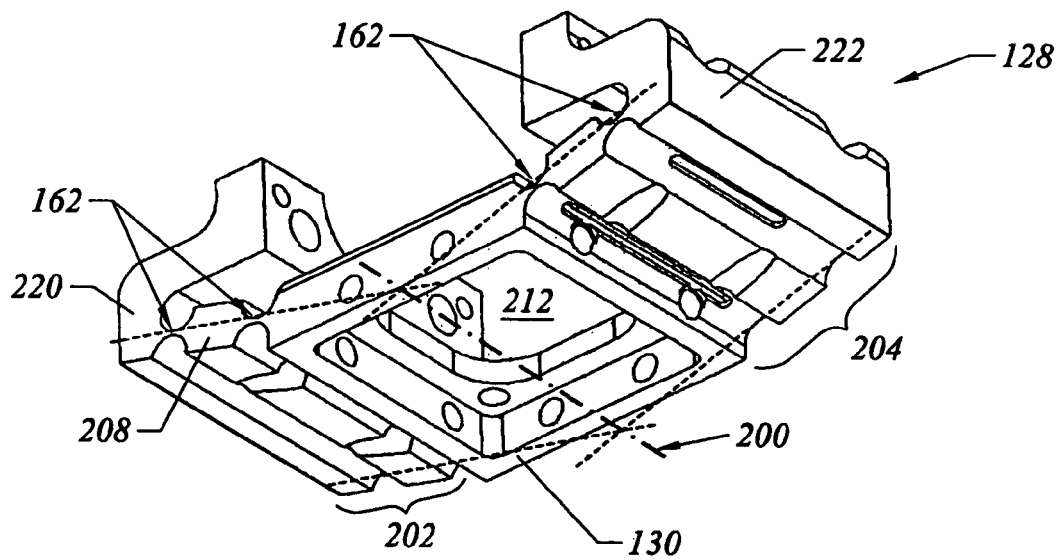

With reference to FIGS. 6A and 6B, therein are shown first and second flexure members 126 and 128, respectively, in more detail. Specifically, first flexure member 126 is seen to include a plurality of flexure joints 160 coupled to corresponding rigid bodies 164 and 166 which form part of arms 172 and 174 extending from a flexure frame 170. Flexure frame 170 has an opening 182, which permits the penetration of a curing agent, such as UV light, to reach template 150, shown in FIG. 5, when held in template support 130. As shown, four (4) flexure joints 160 provide motion of flexure member 126 about a first orientation axis 180. Flexure frame 170 of first flexure member 126 provides a coupling mechanism for joining with second flexure member 128, as illustrated in FIG. 7.

Likewise, second flexure member 128, shown in FIG. 6B, includes a pair of arms 202 and 204 extending from a frame 206 and including flexure joints 162 and corresponding rigid bodies 208 and 210 which are adapted to cause motion of flexure member 128 about a second orientation axis 200. Template support 130 is integrated with frame 206 of second flexure member 128 and, like frame 170, shown in FIG. 6A, has an opening 212 permitting a curing agent to reach template 150, shown in FIG. 5, when held by template support 130.

Figure 7:
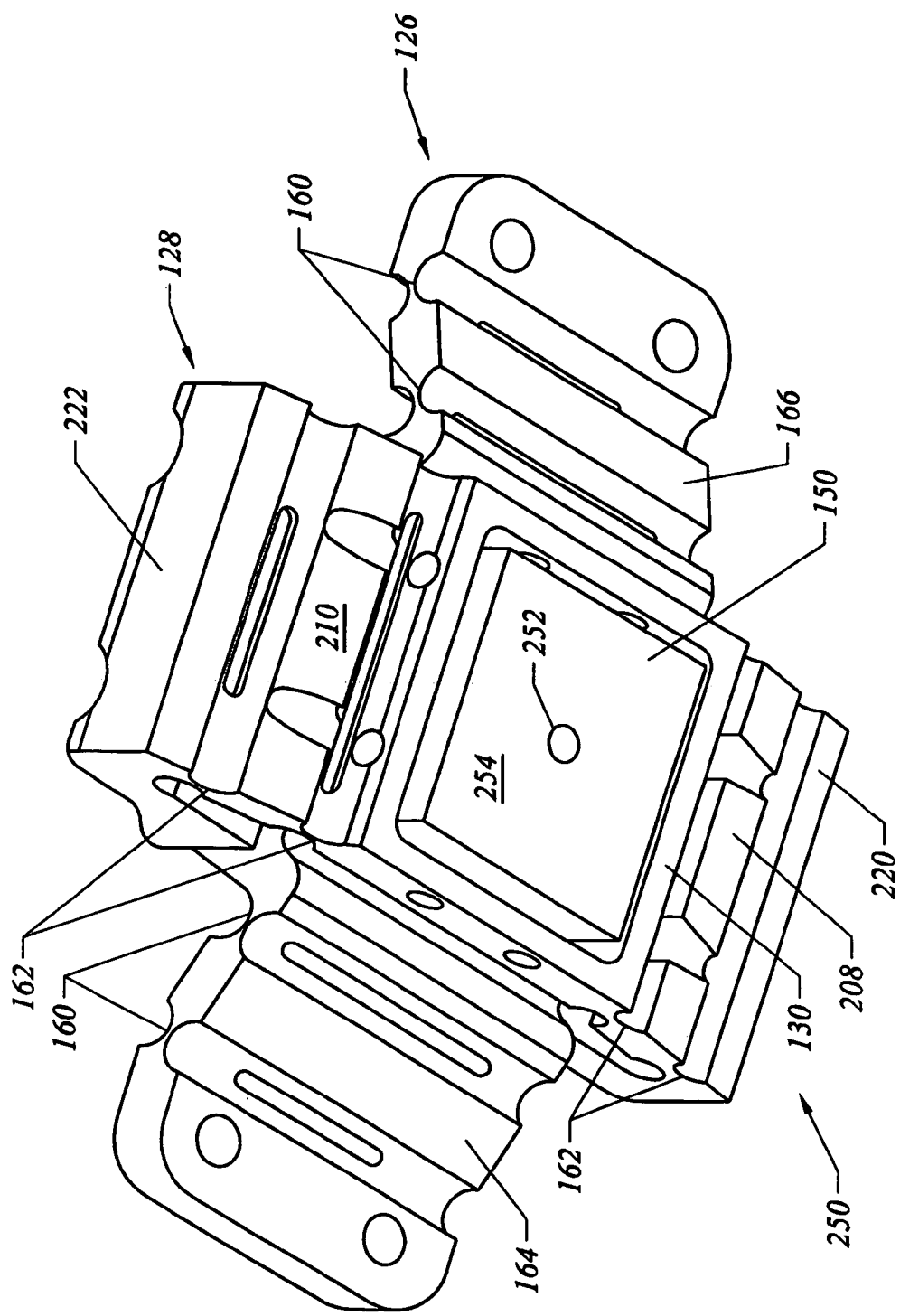
FIG. 7 shows the assembled fine orientation stage with first and second flexure members coupled to each other so that their orientation axes converge on a single pivot point.

In operation, first flexure member 126 and second flexure member 128 are joined, as shown in FIG. 7, to form the orientation stage 250 of the present invention. Braces 220 and 222 are provided in order to facilitate joining of the two pieces such that first orientation axis 180, shown in FIG. 6A, and second orientation axis 200, shown in FIG. 6B, are orthogonal to each other and intersect at a pivot point 252 at the template-substrate interface 254. The fact that first orientation axis 180 and second orientation axis 200 are orthogonal and lie on interface 254 provide the fine alignment and the gap control advantages of the invention. Specifically, with this arrangement, a decoupling of orientation alignment from layer-to-layer overlay alignment is achieved. Furthermore, as explained below, the relative position of first orientation axis 180 and second orientation axis 200 provides orientation stage 250 that can be used to separate template 150 from a substrate without shearing of desired features so that features transferred from template 150 remain intact on the substrate.

Referring to FIGS. 6A, 6B and 7, flexure joints 160 and 162 are notch-shaped to provide motion of rigid bodies 164, 166, 208 and 210 about pivot axes that are located along the thinnest cross section of the notches. This configuration provides two (2) flexure-based sub-systems for a fine decoupled orientation stage 250 having decoupled compliant orientation axes 180 and 200. The two flexure members 126 and 128 are assembled via mating of surfaces such that motion of template 150 occurs about pivot point 252 eliminating "swinging" and other motions that would destroy or shear imprinted features from the substrate. Thus, the fact that orientation stage 250 can precisely move template 150 about pivot point 252 eliminates shearing of desired features from a substrate following imprint lithography.

A system, like system 100, shown in FIG. 4, based on the concept of the flexure components has been developed for the imprinting process described above in connection with FIGS. 2A through 2E. One of many potential application areas is the gap control and the overlay alignment required in high-resolution semiconductor manufacturing. Another application may be in the area of single layer imprint lithography for next generation hard disk manufacturing. Several companies are considering such an approach to generate sub-100 nm dots on circular magnetic media. Accordingly, the invention is potentially useful in cost effective commercial fabrication of semiconductor devices and other various kinds of devices, including patterned magnetic media for data storage, micro optical devices, MEMS, biological and chemical devices, X-ray optical devices, etc.

Figure 8:
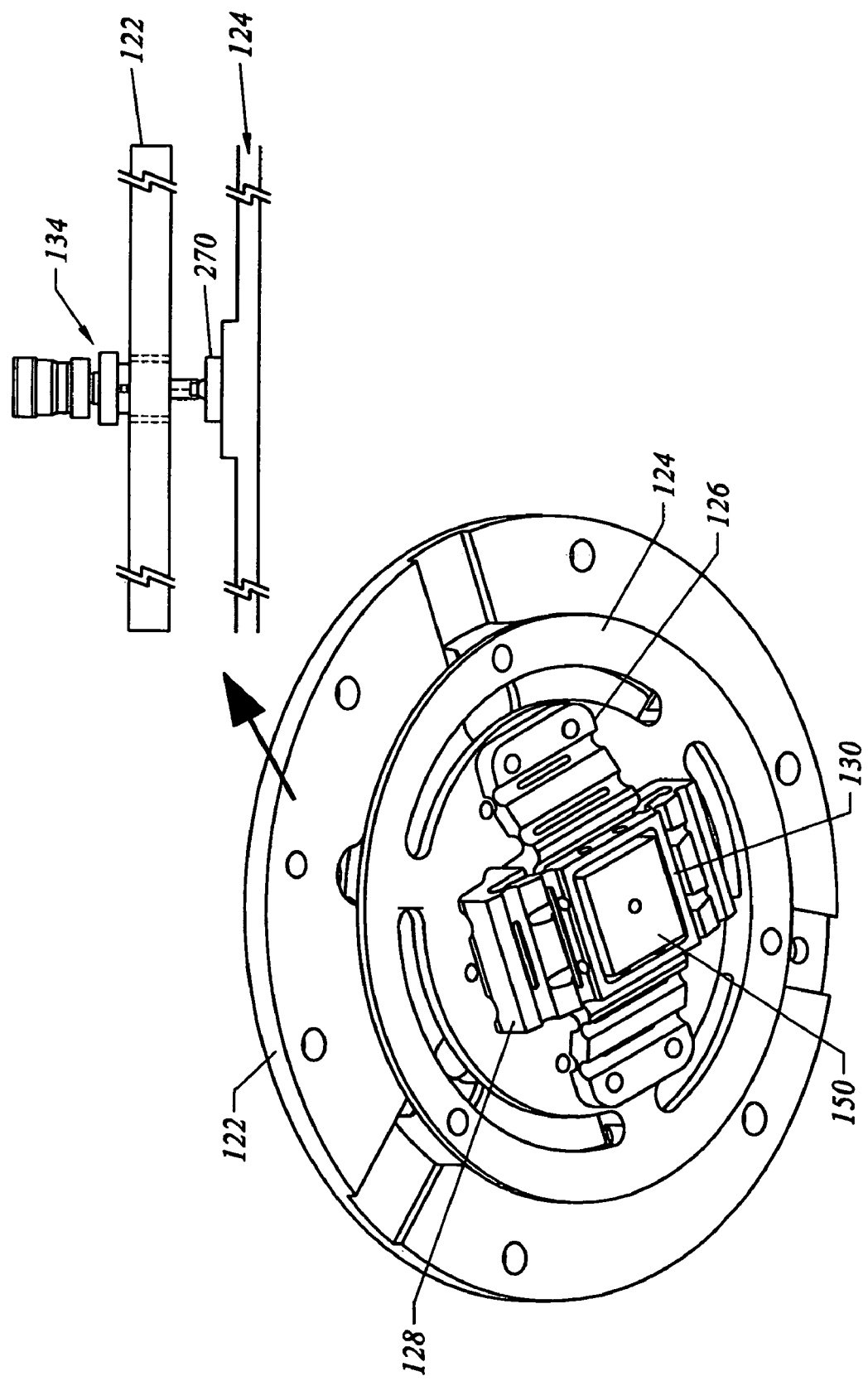
FIG. 8 is an assembly view of the course calibration stage (or pre-calibration stage) coupled to the fine orientation stage according to one embodiment.

Referring to FIG. 8, during operation of system 100, shown in FIG. 4, a Z-translation stage (not shown) controls the distance between template 150 and the substrate without providing orientation alignment. A pre-calibration stage 260 performs a preliminary alignment operation between template 150 and the wafer surfaces to bring the relative alignment to within the motion range limits of orientation stage 250, shown in FIG. 7. Pre-calibration is required only when a new template is installed into the machine.

Pre-calibration stage 260 is made of base plate 122, flexure ring 124, and actuators 134a, 134b and 134c (collectively 134) that interconnect base plate 122 and flexure ring 124 via load cells 270 that measure the imprinting and the separation forces in the Z-direction. Actuators 134a, 134b and 134c can be three differential micrometers capable of expanding and contracting to cause motion of base plate 122 and flexure ring 124. Alternatively, actuators 134 can be a combination of micrometer and piezo or tip-type piezo actuators, such as those offered by Physik Instruments, Inc.

Pre-calibration of template 150 with respect to a substrate can be performed by adjusting actuators 134, while visually inspecting the monochromatic light induced fringe pattern appearing at the interface of the template lower surface and the substrate top surface. Using differential micrometers, it has been demonstrated that two flat surfaces can be oriented parallel within 200 nm error across 1 inch using fringes obtained from green light.

Figure 9:
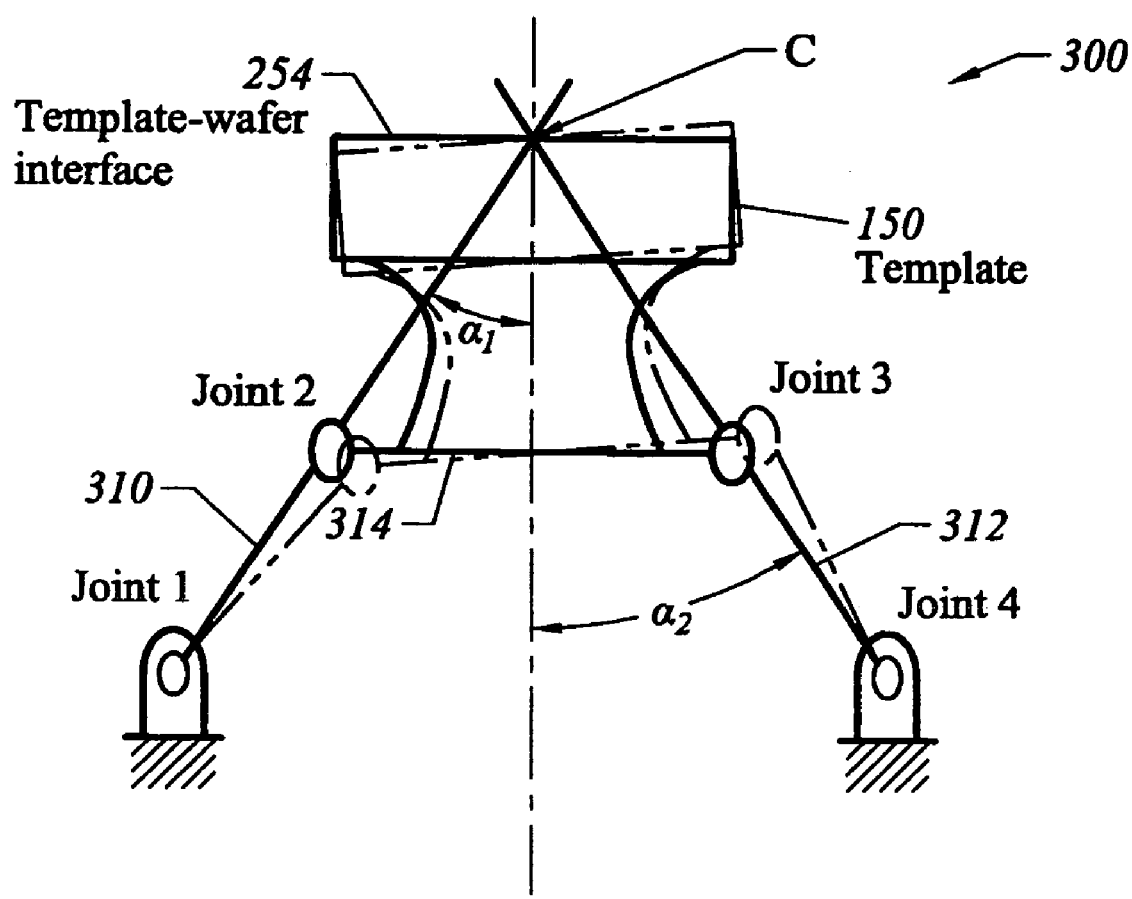
FIG. 9 is a simplified diagram of a 4-bar linkage illustrating the motion of flexure joints that results in an orientation axis.

With reference to FIG. 9, therein is shown a flexure model, denoted generally as 300, useful in understanding the principles of operation for a fine decoupled orientation stage, such as orientation stage 250 of FIG. 7. Flexure model 300 includes four (4) parallel joints—Joints 1, 2, 3 and 4—that provide a four-bar-linkage system in its nominal and rotated configurations. The angles $\alpha_1$ and $\alpha_2$ between the line 310 passing through Joints 1 and 2 and the line 312 passing through Joints 3 and 4, respectively, are selected so that the compliant alignment axis lies exactly on the template-wafer interface 254 within high precision machining tolerances (a few microns). For fine orientation changes, the rigid body 314 between Joints 2 and 3 rotates about an axis that is depicted by Point C. Rigid body 314 is representative of rigid bodies 164 and 208 of flexure members 126 and 128, shown in FIGS. 6A and 6B, respectively.

Since a similar second flexure component is mounted orthogonally onto the first one, as shown in FIG. 7, the resulting orientation stage 250 has two decoupled orientation axes that are orthogonal to each other and lie on template-substrate interface 254. The flexure components can be readily adapted to have openings so that a curing UV light can pass through template 150 as required in lithographic applications.

Orientation stage 250 is capable of fine alignment and precise motion of template 150 with respect to a substrate and, as such, is one of the key components of the present invention. The orientation adjustment, which orientation stage 250 provides ideally, leads to negligible lateral motion at the interface and negligible twisting motion about the normal to the interface surface due to selectively constrained high structural stiffness. The second key component of the invention is flexure-based members 126 and 128 with flexure joints 160 and 162 which provide for no particle generation and which can be critical for the success of imprint lithography processes.

This invention assumes the availability of the absolute gap sensing approach that can measure small gaps of the order of 200 nm or less between template 150 and the substrate with a resolution of a few nanometers. Such gap sensing is required as feedback if gap control is to be actively measured by use of actuators.

Figure 10:
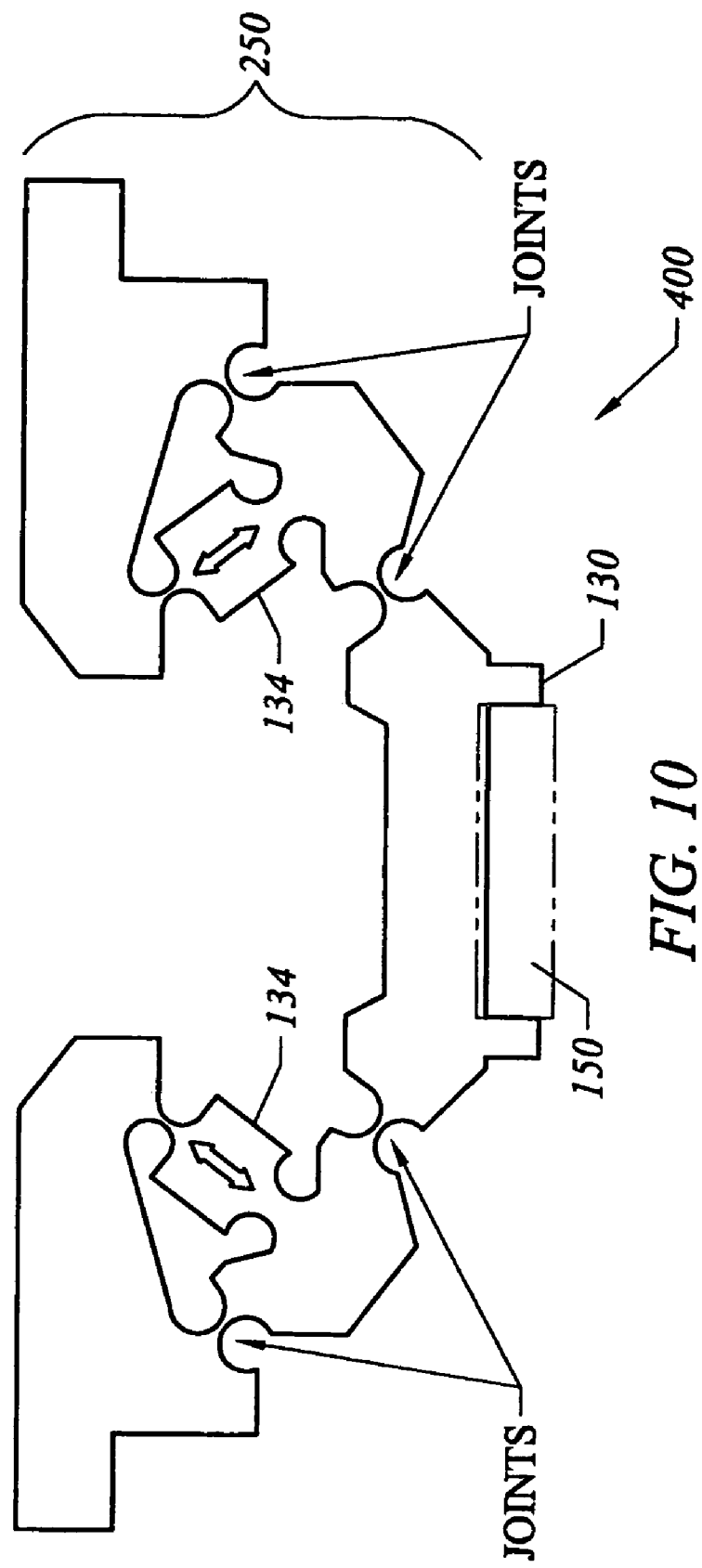
FIG. 10 illustrates a side view of the assembled orientation stage with piezo actuators.

FIG. 10 shows a configuration of orientation stage 250 with piezo actuators, denoted generally as 400. Configuration 400 generates pure tilting motions with no lateral motions at template-substrate interface 254, shown in FIG. 7. Therefore, a single overlay alignment step will allow the imprinting of a layer on the entire wafer. For overlay alignment, coupled motions between the orientation and the lateral motions lead to inevitable disturbances in X-Y alignment, which requires a complicated field-to-field overlay control loop.

Preferably, orientation stage 250 possesses high stiffness in the directions where side motions or rotations are undesirable and lower stiffness in directions where necessary orientation motions are desirable, which leads to a selectively compliant device. Therefore, orientation stage 250 can support relatively high loads while achieving proper orientation kinematics between template 150 and the substrate.

Figure 12:
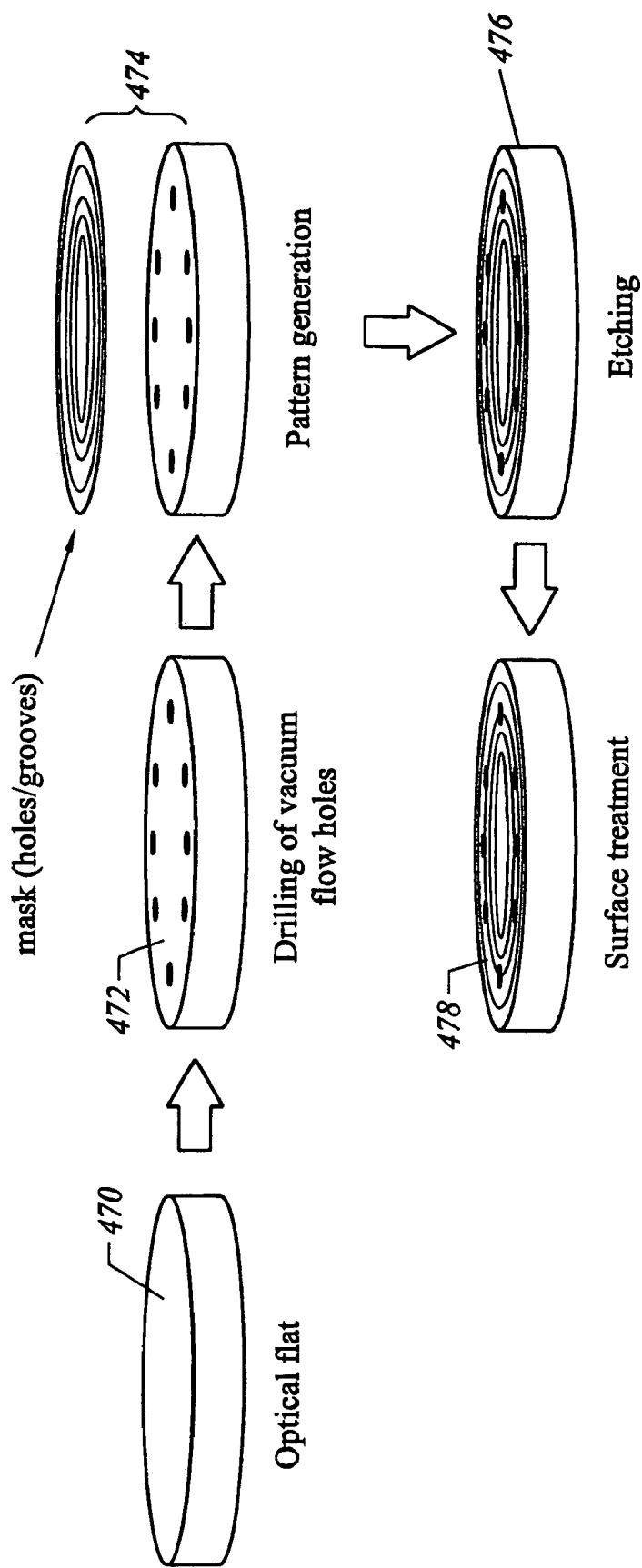
FIG. 12 illustrates the method for manufacturing a vacuum chuck of the types illustrated in FIGS. 11A and 11B.

With imprint lithography, a requirement exists that the gap between two extremely flat surfaces be kept uniform. Typically, template 150 is made from optical flat glass using electron beam lithography to ensure that it is substantially flat on the bottom. The wafer substrate, however, can exhibit a "potato chip" effect resulting in small micron-scale variations on its topography. The present invention provides a device, in the form of a vacuum chuck 478, as shown in FIG. 12, to eliminate variations across a surface of the wafer substrate that can occur during imprinting.

Figure 11A:
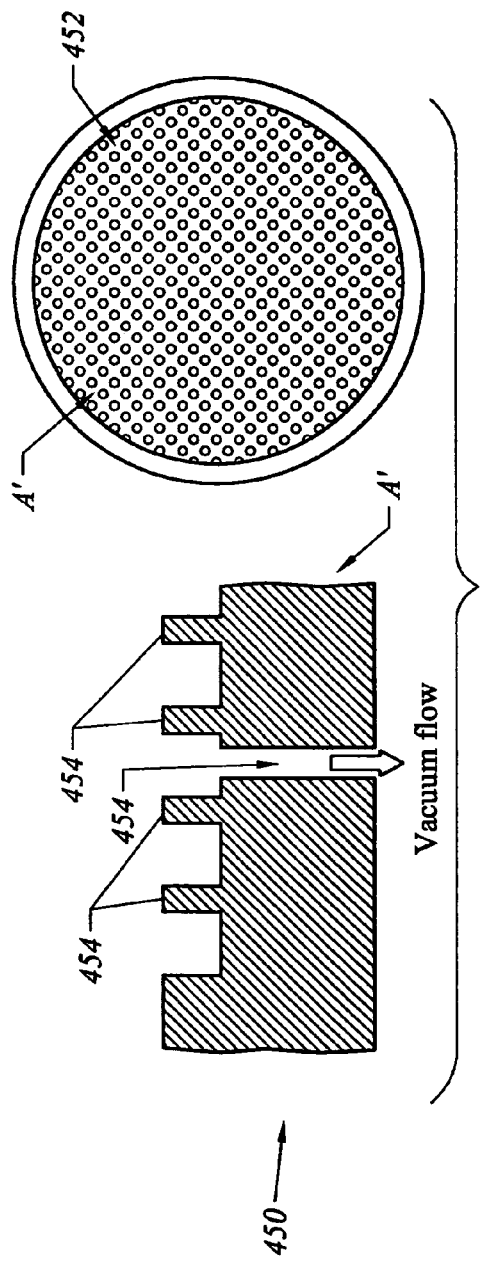
FIGS. 11A and 11B illustrate configurations for a vacuum chuck according to the invention.
Figure 11B:
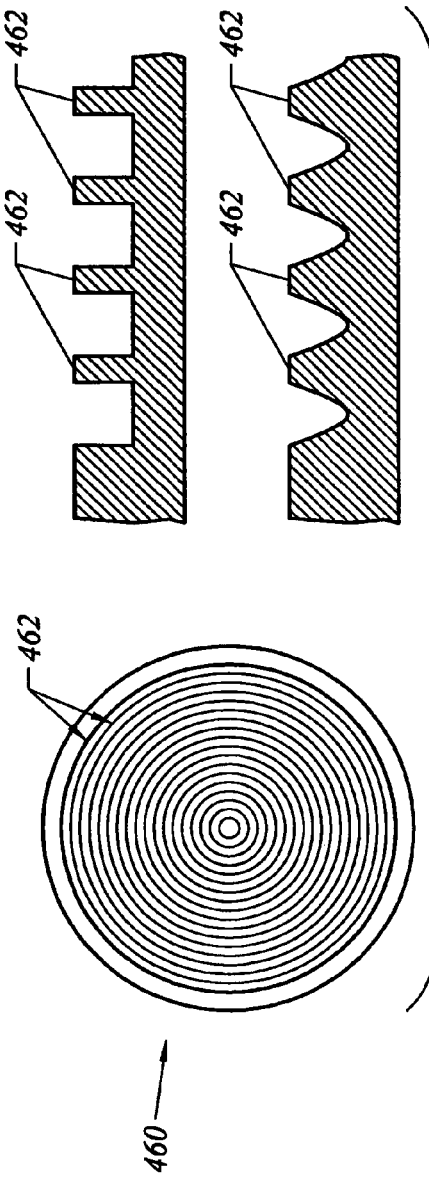

Vacuum chuck 478 serves two primary purposes. First, vacuum chuck 478 is utilized to hold the substrate in place during imprinting and to ensure that the substrate stays flat during the imprinting process. Additionally, vacuum chuck 478 ensures that no particles are present on the back of the substrate during processing. This is important to imprint lithography as particles can create problems that ruin the device and can decrease production yields. FIGS. 11A and 11B illustrate variations of a vacuum chuck suitable for these purposes according to two embodiments.

In FIG. 11A, a pin-type vacuum chuck 450 is shown as having a large number of pins 452 that eliminates the "potato chip" effect, as well as other deflections, on the substrate during processing. A vacuum channel 454 is provided as a means of pulling on the substrate to keep it in place. The spacing between pins 452 is maintained so the substrate will not bow substantially from the force applied through vacuum channel 454. At the same time, the tips of pins 452 are small enough to reduce the chance of particles settling on top of them.

Thus, with pin-type vacuum chuck 450, a large number of pins 452 are used to avoid local bowing of the substrate. At the same time, the pin heads should be very small since the likelihood of the particle falling in between the gaps between pins 452 can be high, avoiding undesirable changes in the shape of the substrate itself.

FIG. 11B shows a groove-type vacuum chuck 460 with grooves 462 across its surface. The multiple grooves 462 perform a similar function to pins 452 of pin-type vacuum chuck 450, shown in FIG. 11A. As shown, grooves 462 can take on either a wall shape 464 or have a smooth curved cross section 466. Cross section 466 of grooves 462 for groove-type vacuum chuck 460 can be adjusted through an etching process. Also, the space and the size of each groove 462 can be as small as hundreds of microns. Vacuum flow to each of grooves 462 can be provided typically through fine vacuum channels across multiple grooves that run in parallel with respect to the chuck surface. The fine vacuum channels can be made along with the grooves through an etching process.

FIG. 12 illustrates the manufacturing process for both pin-type vacuum chuck 450, shown in FIG. 11A, and groove-type vacuum chuck 460, shown in FIG. 11B. Using optical flats 470, no additional grinding and polishing steps are necessary for this process. Drilling at specified places of optical flats 470 produces vacuum flow holes 472 which are then masked and patterned (474) before etching (476) to produce the desired feature—either pins or grooves—on the upper surface of optical flat 470. The surface can then be treated (479) using well-known methods.

Figure 13A:
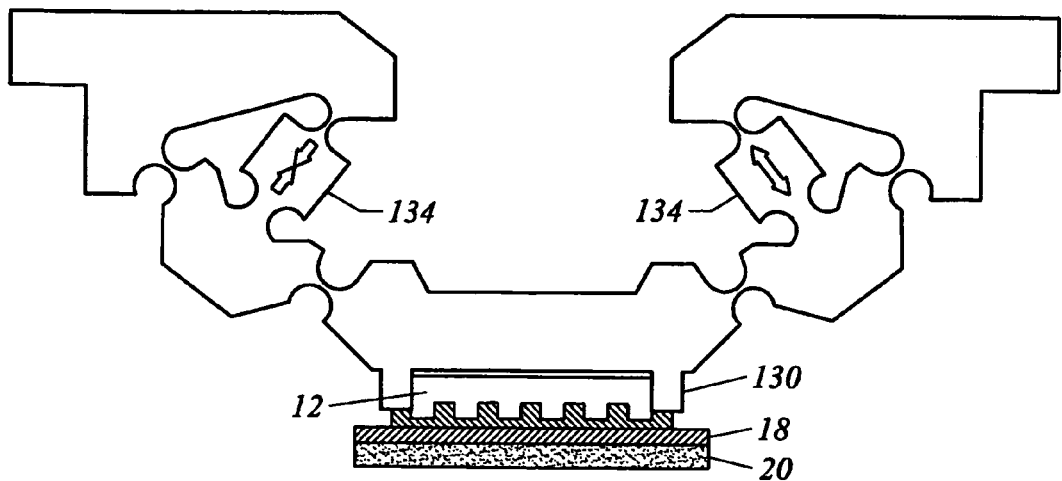
FIGS. 13A through 13C illustrate use of the fine orientation stage to separate a template from a substrate using the "peel-and-pull" method of the present invention.
Figure 13B:
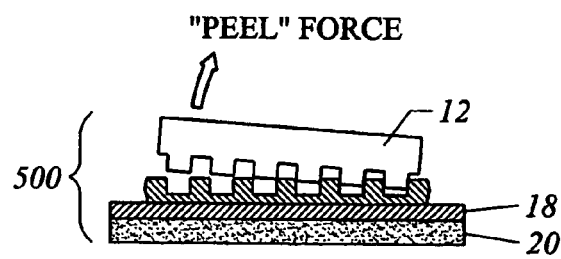
Figure 13C:
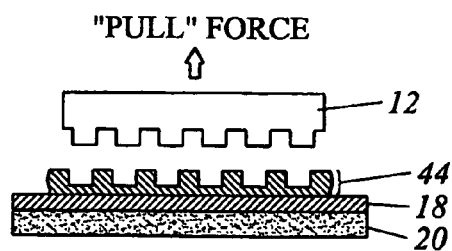

As discussed above, separation of template 150 from the imprinted layer is a critical and important final step of imprint lithography. Since template 150 and the substrate are almost perfectly oriented, the assembly of template 150, the imprinted layer, and the substrate leads to a uniform contact between near optical flats, which usually requires a large separation force. In the case of a flexible template or a substrate, the separation can be merely a "peeling process." However, a flexible template or a substrate is undesirable from the point of view of high-resolution overlay alignment. In the case of quartz template and silicon substrate, the peeling process cannot be implemented easily. The separation of the template from an imprinted layer can be performed successfully either by one of the two following schemes or the combination of them, as illustrated by FIGS. 13A, 13B and 13C.

For clarity, reference numerals 12, 18 and 20 will be used in referring to the template, the transfer layer and the substrate, respectively, in accordance with FIGS. 1A and 1B. After UV curing of substrate 20, either template 12 or substrate 20 can be tilted intentionally to induce a wedge 500 between template 12 and transfer layer 18 on which the imprinted layer resides. Orientation stage 250, shown in FIG. 10, of the present invention can be used for this purpose, while substrate 20 is held in place by vacuum chuck 478, shown in FIG. 12. The relative lateral motion between template 12 and substrate 20 can be insignificant during the tilting motion if the tilting axis is located close to the template-substrate interface, shown in FIG. 7. Once wedge 500 between template 12 and substrate 20 is large enough, template 12 can be separated from substrate 20 completely using Z-motion. This "peel and pull" method results in the desired features 44, shown in FIG. 2E, being left intact on transfer layer 18 and substrate 20 without undesirable shearing.

Figure 14A:
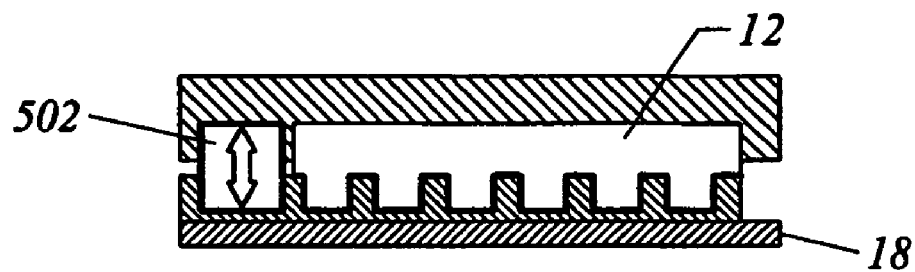
FIGS. 14A through 14C illustrate an alternative method of separating a template from a substrate using a piezo actuator.
Figure 14B:
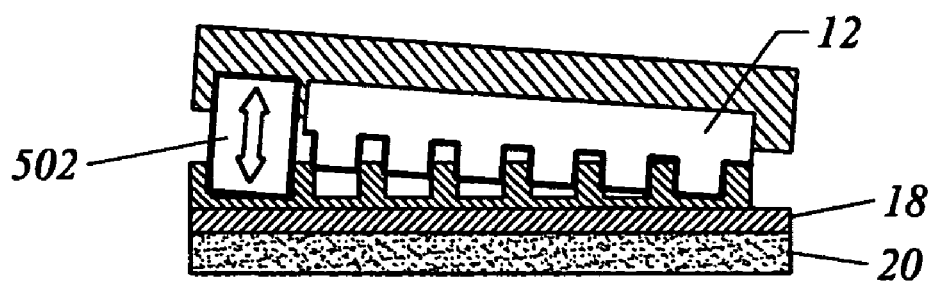
Figure 14C:
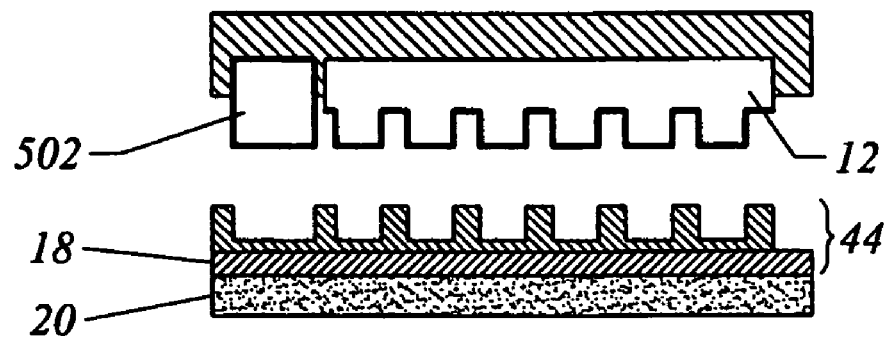

An alternative method of separating template 12 from substrate 20 without destroying the desired features 44 is illustrated by FIGS. 14A, 14B and 14C. One or more piezo actuators 502 are installed adjacent to template 12, and a relative tilt can be induced between template 12 and substrate 20, as shown in FIG. 14A. The free end of the piezo actuator 502 is in contact with substrate 20 so that when actuator 502 is enlarged, as shown in FIG. 14B, template 12 can be pushed away from substrate 20. Combined with a Z-motion between template 12 and substrate 20 (FIG. 14C), such a local deformation can induce a "peeling" and "pulling" effect between template 12 and substrate 20. The free end side of piezo actuator 502 can be surface treated similar to the treatment of the lower surface of template 12 in order to prevent the imprinted layer from sticking to the surface of piezo actuator 502.

In summary, the present invention discloses a system, processes and related devices for successful imprint lithography without requiring the use of high temperatures or high pressures. With the present invention, precise control of the gap between a template and a substrate on which desired features from the template are to be transferred is achieved. Moreover, separation of the template from the substrate (and the imprinted layer) is possible without destruction or shearing of desired features. The invention also discloses a way, in the form of suitable vacuum chucks, of holding a substrate in place during imprint lithography.

While this invention has been described with a reference to illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A system to define a relative orientation between a body and a substrate spaced apart from said body, said system comprising:

a flexure system defining first and second axes of rotation, with said body being coupled to said flexure system to rotate about said first and second axes in response to contact with a fluid material compressed between said body and said substrate, said first axis extending transversely to said second axis.

2. The device as recited in claim 1 wherein said flexure system includes a first flexure member and a second flexure member, with said body being coupled to said flexure system to rotate about said first and second axes in response to contact with said surface, said first axis extending transversely to said second axis, wherein movement of said body about said first axis is decoupled from movement of said body about said second axis.

3. The device as recited in claim 2 wherein said first axis is spaced apart from said first flexure member and said second axis is spaced apart from said second flexure member.

4. The device as recited in claim 2 wherein said first flexure member further includes a mount, a pair of spaced apart braces, a first flexure arm connected between said mount and one of said pair of spaced-apart braces, a second flexure arm connected between said mount and one of said pair of spaced-apart braces disposed opposite to said first flexure arm, said first flexure arm includes a first rigid body wherein a first flexure joint is disposed between said mount and said first rigid body, and a second flexure joint is disposed between said first rigid body and brace, with said first and second flexure joints to provide motion to said first rigid body, said second flexure arm includes a second rigid body wherein a third flexure joint is disposed between said mount and said second rigid body and a fourth flexure joint is disposed between said second rigid body and brace, with said third and fourth flexure joints to provide motion to said second rigid body.

5. The device as recited in claim 2 wherein said first flexure member further includes a mount, a pair of spaced apart braces, a first flexure arm connected between said mount and one of said pair of spaced-apart braces, a second flexure arm connected between said mount and one of said pair of spaced-apart braces disposed opposite to said first flexure arm, said first flexure arm includes a first flexure region disposed between said mount and brace, wherein said first flexure region further includes two flexure joints and a first rigid body, said second flexure arm includes a second flexure region disposed between said mount and brace, wherein said second flexure region further includes two flexure joints and a second rigid body.

6. The device as recited in claim 2 wherein said first flexure member is coupled to said second flexure member.

7. The system as recited in claim 1 wherein said flexure system comprises eight distinct joints, said joints spaced apart from a pivot point defined by intersection of said first axis and said second axis.

8. The device as recited in claim 7 wherein said flexure system includes four bar-linkages coupled together to pivot about said single point.

9. The system as recited in claim 4 wherein said mount comprises a through-hole for penetration of a curing light.

10. The device as recited in claim 1 wherein said flexure system further comprises a plurality of piezo actuators attached to apply a force to rotate said body.

11. A device to orientate a body with respect to a surface spaced apart from said body, said device comprising:

a flexure system, said flexure system comprising a first flexure member and a second flexure member; and a body coupled to said flexure system, with said flexure system adapted to position said body in a desired orientation with respect to said surface and maintain said orientation in response to a force being exerted upon said body by a fluid material compressed between said body and said surface.

12. The system as recited in claim 11 wherein said first flexure member and said second flexure member further comprises:
a mount;
a pair of spaced apart braces;
a first flexure arm connected between said mount and one of said pair of spaced-apart braces, said first flexure arm includes a first rigid body wherein a first flexure joint is disposed between said mount and said first rigid body, and a second flexure joint is disposed between said first rigid body and said brace; and
a second flexure arm connected between said mount and one of said pair of spaced-apart braces disposed opposite to said first flexure arm, said second flexure arm includes a second rigid body wherein a third flexure joint is disposed between said mount and said second rigid body and a fourth flexure joint is disposed between said second rigid body and said brace.

13. The system as recited in claim 11 wherein said first flexure member defines a first axis of rotation and said second flexure member defines a second axis of rotation, with said body being coupled to said first flexure member and said second flexure member to rotate about said first and second axes in response to contact with said surface, said first axis extending transversely to said second axis, wherein said movement of said body about said first axis is decoupled from movement of said body about said second axis.

14. The system as recited in claim 13 wherein said first axis is spaced apart from said first flexure member and said second axis is spaced apart from said second flexure member.

15. The system as recited in claim 11 wherein said first flexure member and said second flexure member comprises eight distinct joints, said joints spaced apart from a pivot point defined by intersection of said first axis and said second axis.

16. The system as recited in claim 12 wherein said mount comprises a through-hole for penetration of a curing light.

17. The device as recited in claim 11 wherein said first flexure member and said second flexure member further comprises a plurality of piezo actuators attached to apply a force to rotate said body.

* * * * *